(12) United States Patent
Koshiyama

(10) Patent No.: US 7,940,000 B2
(45) Date of Patent: May 10, 2011

(54) ORGANIC EL DEVICE PANEL AND METHOD FOR MANUFACTURING THE SAME

(75) Inventor: Yoshiki Koshiyama, Tokyo (JP)

(73) Assignee: Toppan Printing Co., Ltd. (JP)

( * ) Notice: Subject to any disclaimer, the term of this patent is extended or adjusted under 35 U.S.C. 154(b) by 260 days.

(21) Appl. No.: 12/260,854

(22) Filed: Oct. 29, 2008

(65) Prior Publication Data

US 2009/0108745 A1   Apr. 30, 2009

(30) Foreign Application Priority Data

Oct. 30, 2007   (JP) ................................ 2007-281210

(51) Int. Cl.
*H05B 33/00* (2006.01)
*H01J 9/00* (2006.01)

(52) U.S. Cl. ............. 313/504; 313/292; 445/23; 445/25

(58) Field of Classification Search .................. None
See application file for complete search history.

(56) References Cited

U.S. PATENT DOCUMENTS

| 7,317,281 B2 * | 1/2008 | Hayashi et al. | 313/512 |
| 7,667,398 B2 * | 2/2010 | Lee et al. | 313/512 |
| 2006/0279209 A1 * | 12/2006 | Yamaguchi et al. | 313/512 |

FOREIGN PATENT DOCUMENTS

| JP | 2001-274551 | 10/2001 |
| JP | 2004-085917 | 3/2004 |

* cited by examiner

*Primary Examiner* — Ashok Patel
(74) *Attorney, Agent, or Firm* — Squire, Sanders & Dempsey (US) LLP

(57) ABSTRACT

An organic EL device panel includes an organic EL device substrate including a substrate, a plurality of organic EL devices which are formed on the substrate, and a plurality of wirings for driving the organic EL devices, a sealing substrate which covers the organic EL devices, and a sealing material which is used for attaching the organic EL device substrate to the sealing substrate, wherein space for placing the sealing material includes a region having a sealing space where there is an overhead crossing of wirings, and wherein the organic EL device substrate is attached to the sealing substrate by a sealing material without a spacer in the region where there is the overhead crossing of wirings.

6 Claims, 14 Drawing Sheets

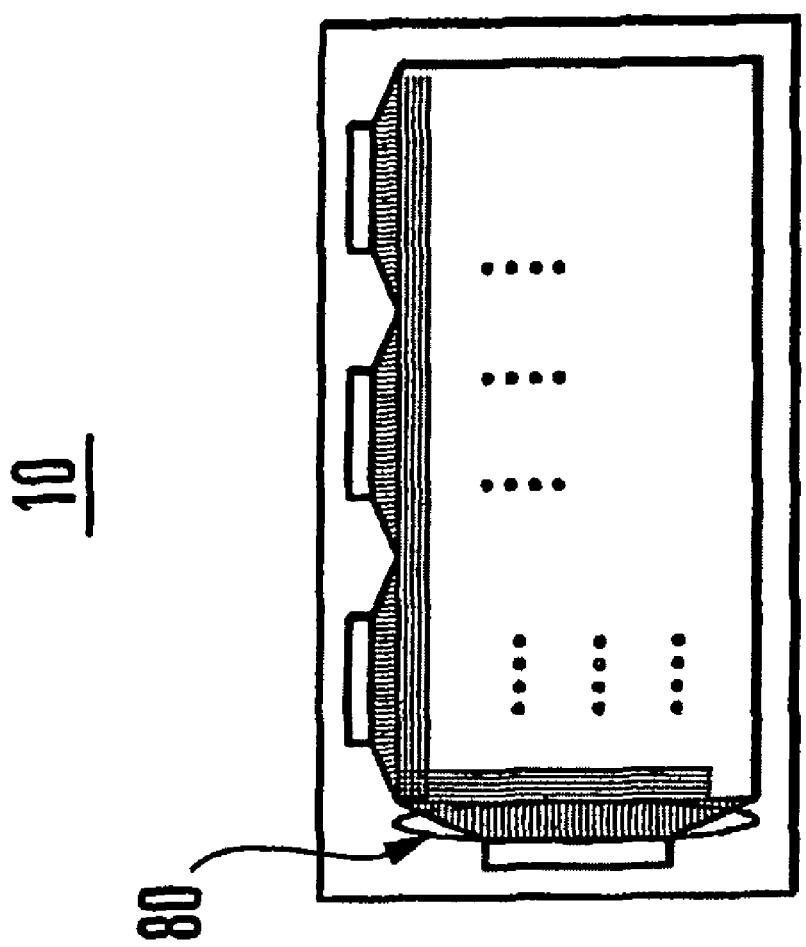

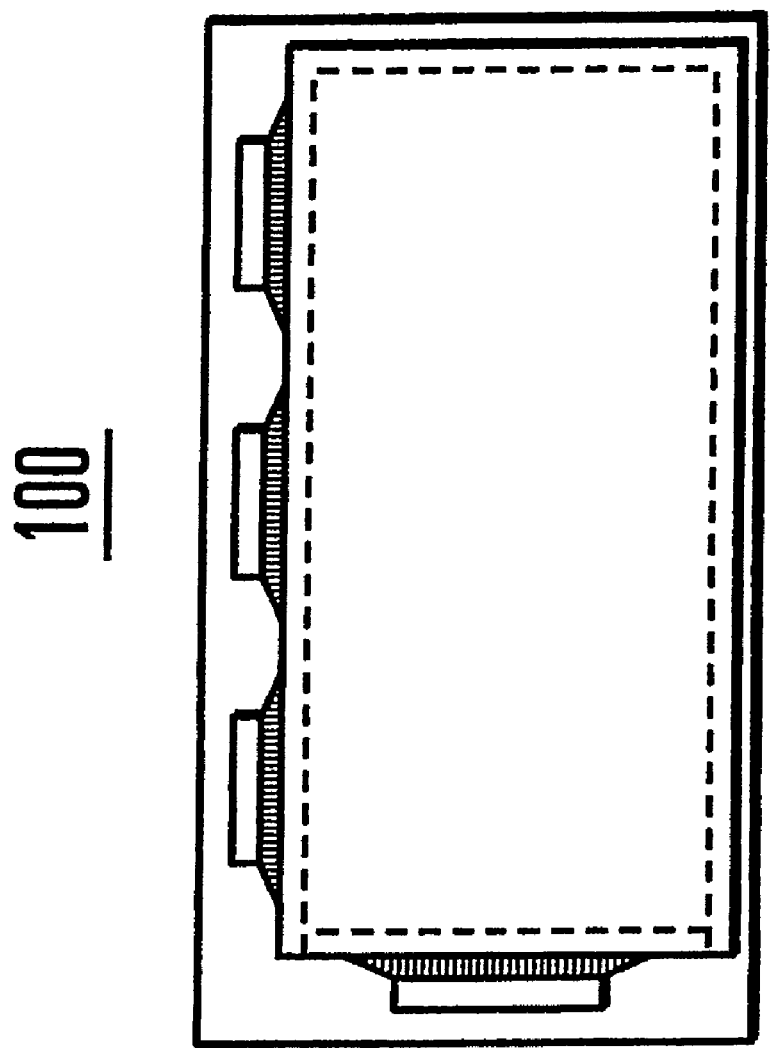

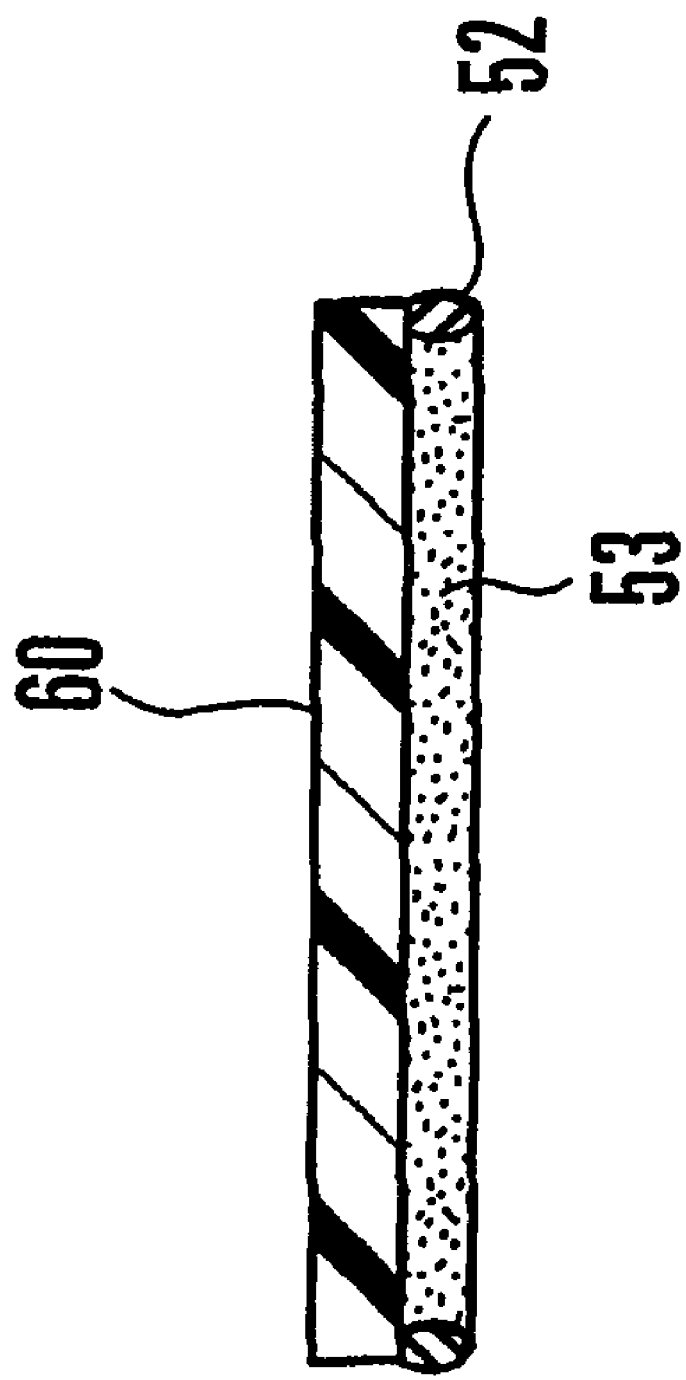

ORGANIC EL DEVICE PANEL AND METHOD FOR MANUFACTURING THE SAME

CROSS REFERENCE

This application is based upon and claims the benefit of priority from the prior Japanese Patent Application No. 2007-281210, filed on Oct. 30, 2007, the entire disclosure of which is incorporated herein by reference.

BACKGROUND OF THE INVENTION

1. Field of the Invention

The present invention is related to an organic EL (electroluminescence) device panel and a method for manufacturing an organic EL device panel. Especially, in the present invention, a sealing material without a spacer is used at a region where there is an overhead crossing of wirings. Therefore, even if a sealing pressure is excessive, a spacer does not sink. Thereby, an upper wiring does not come in contact with a lower wiring. Therefore, the upper wiring is not electrically connected with the lower wiring. So, if there are many overhead crossings of wirings for the purpose of achieving a high definition and a narrow frame, a sealing material does not cause a bad influence.

2. Description of the Related Art

An EL device is a self-luminous device. Therefore, the EL device is superior in terms of visibility compared with a liquid crystal display device. Therefore, so far, the following EL devices are proposed: various inorganic EL devices using an inorganic compound as a light emitting material; and various organic EL devices using an organic compound as a light emitting material. Besides, a practical use of a display apparatus having a pixel of an organic EL device has been advanced.

As for an organic EL display apparatus, a surrounding gas which enters inside the apparatus influences the life duration of an organic EL device. Especially, moisture or oxygen causes a degradation of a metal electrode. Thereby, a non-light emitting area which is called a dark spot occurs. Therefore, sealing is performed by using a sealing substrate such as a sealing cap or a planar glass in order to obtain a barrier against moisture or oxygen.

In the case where a sealing substrate is formed on an organic EL device substrate having an organic EL device, space is necessary for attaching a sealing substrate to an organic EL device substrate by means of an adhesive. In addition, a certain width for adhesive (a sealing space) is also necessary in order to obtain the above-mentioned gas barrier. Sealing of an organic EL device substrate is performed at a periphery of this substrate. Therefore, there is so called a frame in the periphery, the frame being not used for a display region.

A sealing space for attaching a sealing substrate to an organic EL device substrate is necessary on a frame. Besides, a space for arranging a driver IC is necessary on a frame. Wirings which connect a driver IC with an organic EL device is necessarily arranged on a frame. The control of the states of respective organic EL devices can allow a screen comprised of a character, an image or a movie to be displayed. When a definition of an organic EL device becomes high, an area for wirings increases. Thereby, it becomes difficult for an apparatus such as a mobile phone and a mobile information machine to be small. (The apparatus has a display apparatus in spite of an organic EL device.) Then, wirings have a structure in which there are overhead crossings of wirings. The structure can allow a frame to be narrow. (See JP-A-2001-274551)

A sealing material which attaches a sealing substrate to an organic EL device substrate includes spacers. Spacers can make an adhesive sickness uniform. (See JP-A-2004-85917) However, if a sealing material including spacers is used for a region where there are overhead crossings of wirings, spacers sink due to an excess sealing pressure. This causes an electrical connection of an upper wire with a lower wire.

The present invention provides an organic EL device panel and a method for manufacturing an organic EL device panel having following feature: a sealing material without a spacer is used at a region where there is an overhead crossing of wirings. Therefore, even if a sealing pressure is excessive, a spacer does not sink. Thereby, an upper wiring does not come in contact with a lower wiring. Therefore, the upper wiring is not electrically connected with the lower wiring. So, if there are many overhead crossings of wirings for the purpose of achieving a high definition and a narrow frame, a sealing material does not cause a bad influence.

SUMMARY OF THE INVENTION

One embodiment of the present invention is an organic EL device panel including an organic EL device substrate including a substrate, a plurality of organic EL devices which are formed on the substrate, and a plurality of wirings for driving the organic EL devices, a sealing substrate which covers the organic EL devices, and a sealing material which is used for attaching the organic EL device substrate to the sealing substrate, wherein space for placing the sealing material includes a region having a sealing space where there is an overhead crossing of wirings, and wherein the organic EL device substrate is attached to the sealing substrate by a sealing material without a spacer in the region where there is the overhead crossing of wirings.

BRIEF DESCRIPTION OF THE DRAWINGS

FIG. 3A is a schematic top view of an organic EL device substrate having overhead crossings of wirings.

FIG. 3E is a schematic top view of an organic EL device panel (a sealing material is arranged between an organic EL device substrate and a sealing substrate (a sealing cap)).

FIG. 4C is a schematic cross-sectional diagram of a sealing substrate (a planar glass) with a sealing material.

In these drawings, 1 is a transparent substrate; 2 is a power wire; 3 is a scan line; 4 is an organic EL device; 5 is a driving circuit; 6 is a power wire (on a frame); 7 is a scan line (on a frame); 8 is a TFT; 10 is an organic EL device substrate; 20 is an anode; 30 is an organic EL layer; 31 is a light emitting layer; 32 is a hole injection layer; 33 is an electron injection layer; 34 is a partition wall; 35 is a planarizing layer; 40 is a cathode; 50 is a sealing material; 51 is a sealing material including spacers; 52 is a sealing material without a spacer; 53 is a heat curing type adhesive; 54 is an insulating layer; 55 is a wiring; 60 is a sealing substrate; 70 is a desiccant; 80 is a region where there is an overhead crossing of wirings; and 100 is an organic EL device panel.

DETAILED DESCRIPTION OF THE INVENTION

Hereinafter, embodiments of the present invention are described in detail referring to the figures. In addition, the figures related to the embodiments are used for explaining a constitution of the present invention. Therefore, a size, a thickness and a dimension of respective parts shown in the figure are different from a real size, a real thickness and a real dimension. In addition, the present invention is not limited to the figures.

Figure 1A:
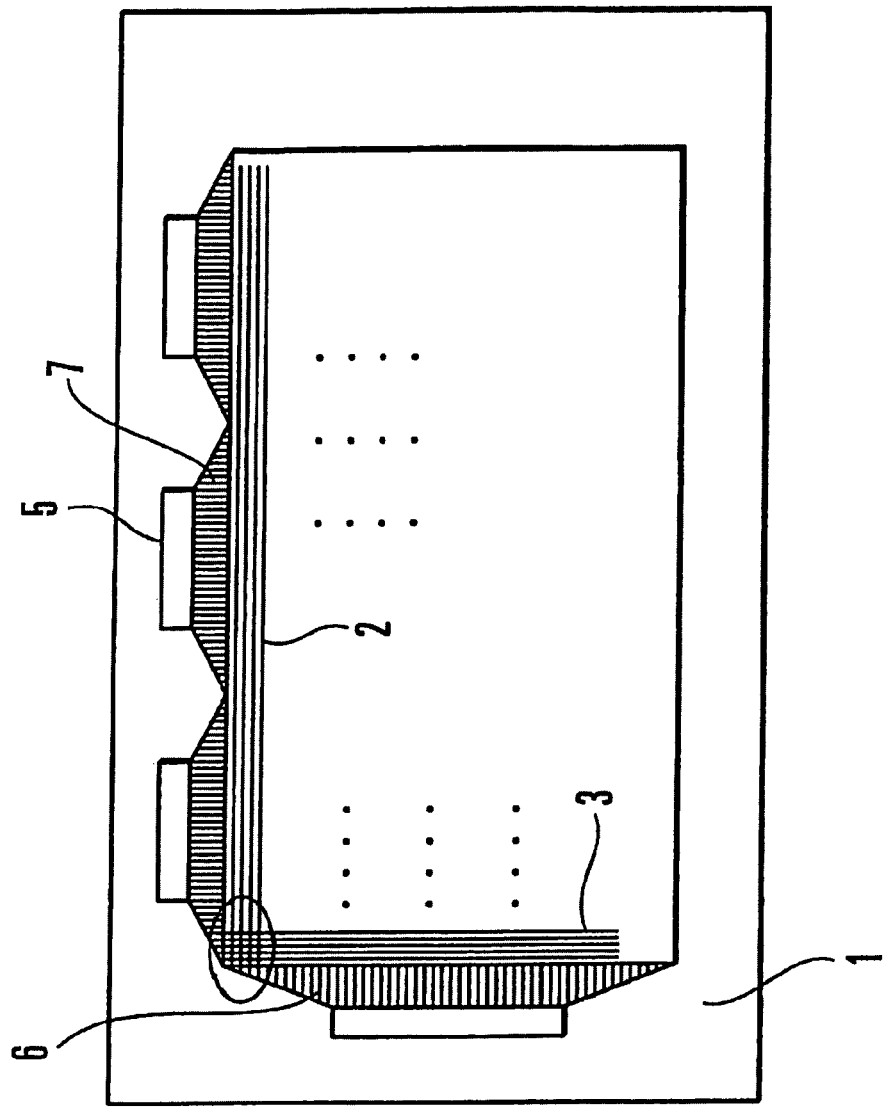
FIG. 1A is a schematic top view showing a structure of an organic EL device substrate of an embodiment of the present invention.
Figure 1B:
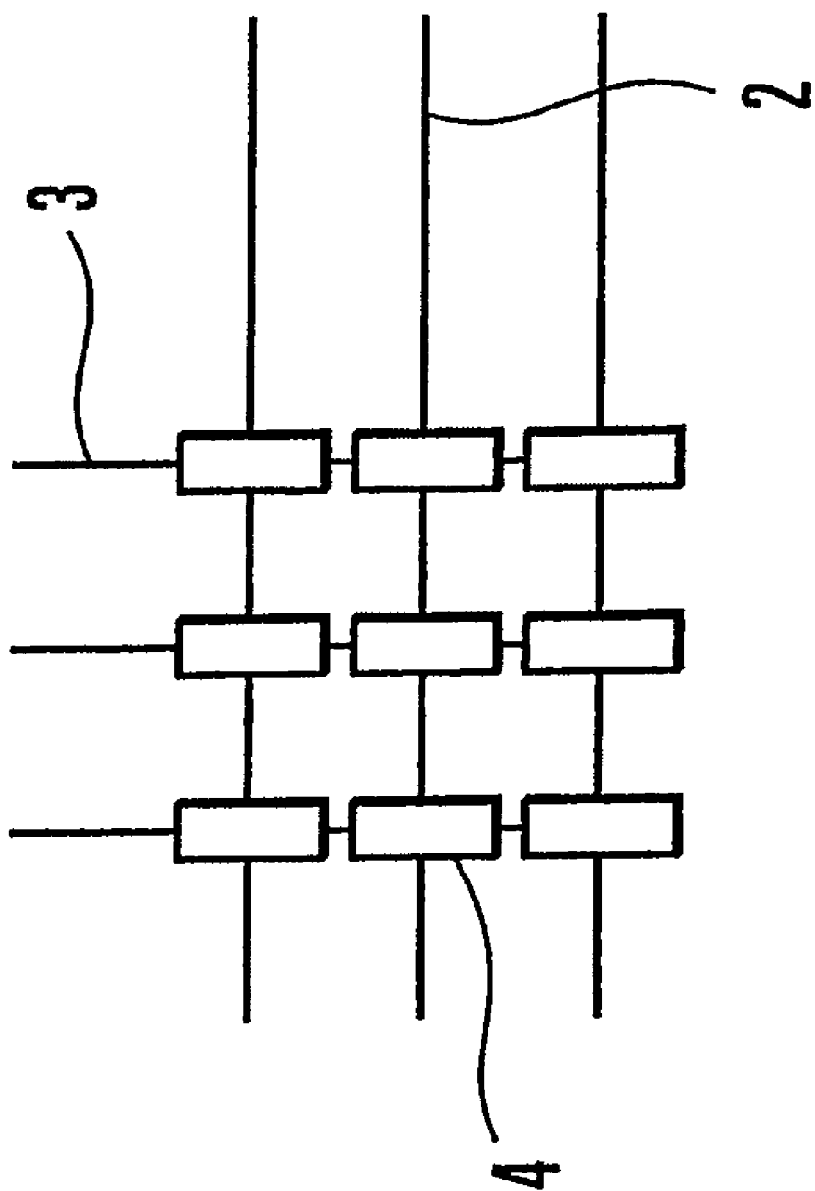
FIG. 1B is an enlarged view of a part indicated by an ellipse shown in FIG. 1A.

FIG. 1A is a schematic top view showing a structure of an organic EL device substrate 10 in an embodiment of the present invention. A plurality of a power wire (line in a row direction) 2 having a conductive film, a plurality of a scan line (line in a column direction) 3 having a conductive film, a driver circuit 5 which supplies a power source and a signal, a power wire 6 which is formed on a frame, and a scan line 7 which is formed on a frame are formed on a transparent substrate 1. FIG. 1B is an enlarged view of a part indicated by an ellipse shown in FIG. 1A. Power wire 2 and scan line 3 are crossed. There is an organic EL device 4 which is a display device arranged as a matrix. An organic EL device 4 is connected with a power wire 2 and a scan line 3 at respective crossing points through a non-illustrated thin film transistor (TFT) and retentive capacity. The number of pixels can be determined according to various standards. In the case of XGA, the number of pixels can be 1024×768×3 (RGB).

Figure 3B:
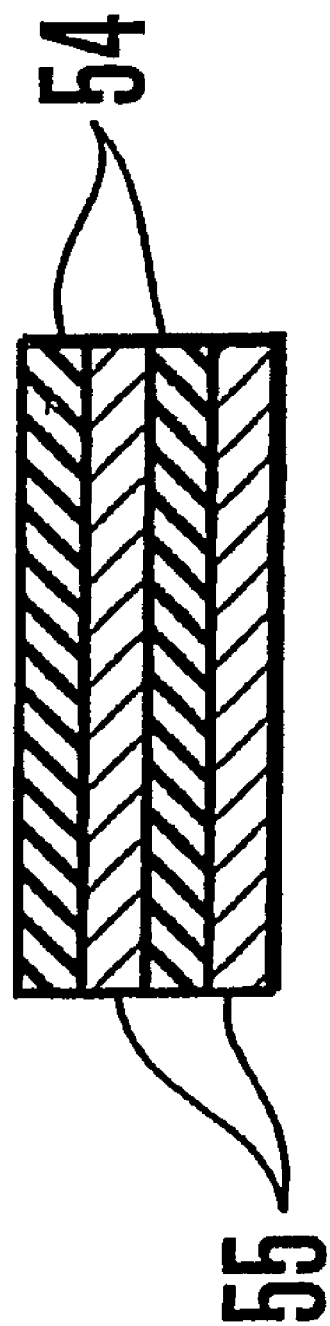
FIG. 3B is a schematic cross-sectional diagram showing overhead crossings of wirings.

In a frame where a power wire 6 and a scan line 7 are arranged, there is a region in which overhead crossings between wirings 55 are arranged. In addition, an overhead crossing region is a part of a sealing space. An overhead crossing between wirings 55 is not especially limited. Wirings 55 can be comprised of an identical wiring. Wirings 55 can be comprised of different wirings. For example, in the case of power wire 6, there is an overhead crossing region. In addition, a material between wirings 55 can be an insulating layer comprised of an insulating resin such as a polyimide system, as shown in FIG. 3B and FIG. 4B.

As for a driver circuit 5 in an embodiment of the present invention, mounting can be performed on a transparent substrate 1 by COG (chip on glass). Mounting can be performed by using a flexible circuit substrate (hereinafter, called FPC). Examples of a technology include a COF (chip on flexible) mounting in which FPC with a driver IC is used, and a TAB (tape automated bonding) using a tape carrier package (hereinafter, called TCP) with a driver IC.

Figure 2A:
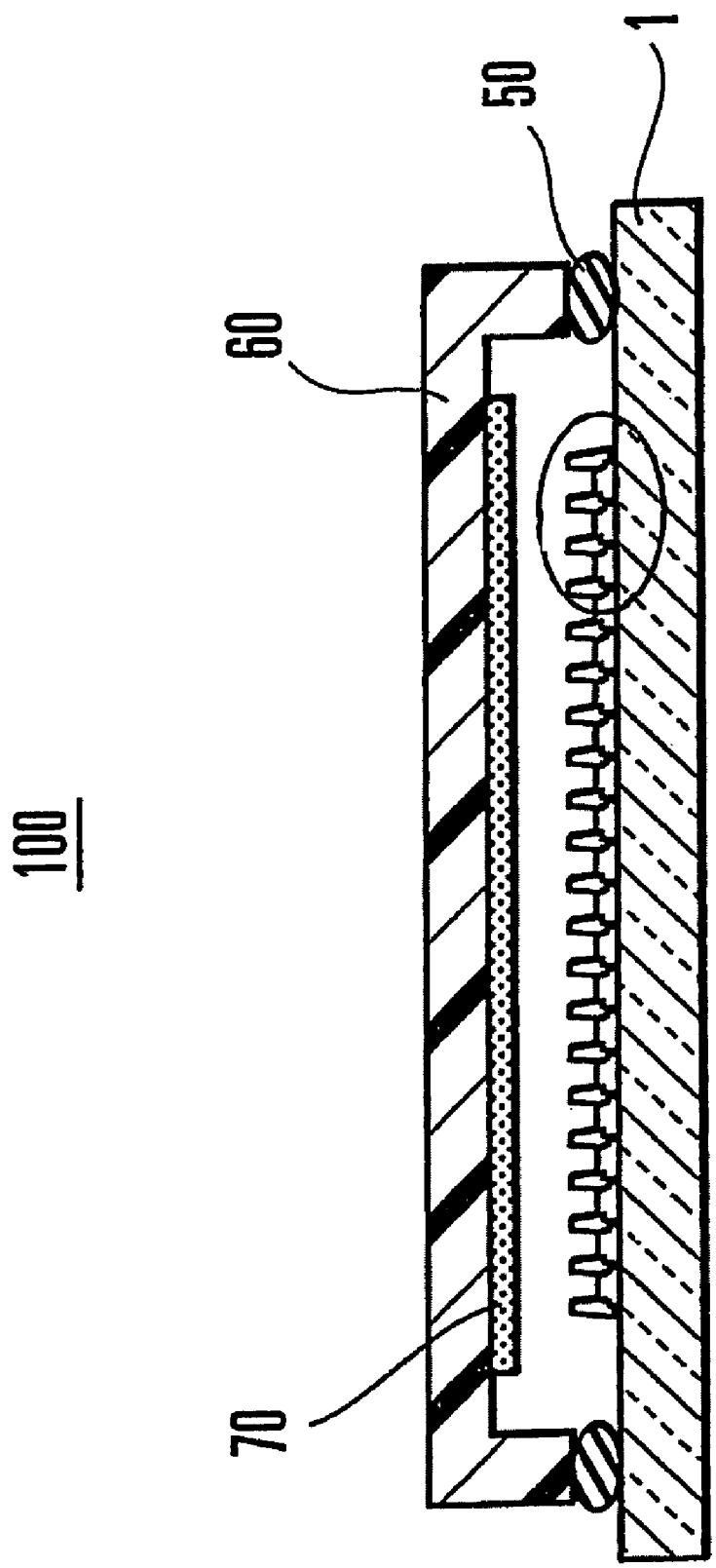
FIG. 2A is a schematic cross-sectional view showing an organic EL device panel of an embodiment of the present invention.
Figure 2B:
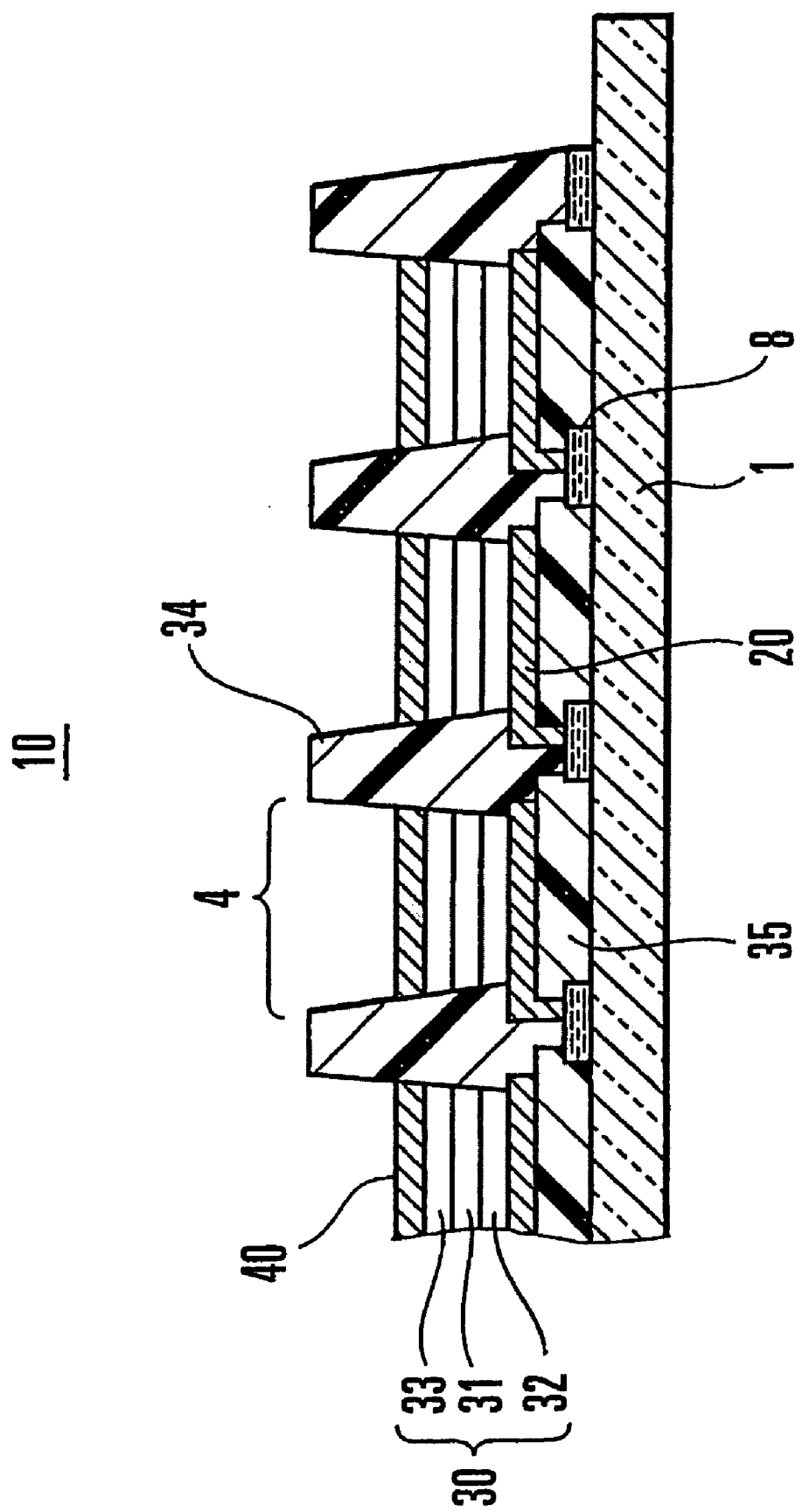
FIG. 2B is a schematic cross-sectional enlarged view of a part indicated by an ellipse shown in FIG. 2A, showing an organic EL device substrate.

FIG. 2A is a schematic cross-sectional view showing an organic EL device panel 100 of an embodiment of the present invention. FIG. 2B is a schematic cross-sectional enlarged view of a part indicated by an ellipse shown in FIG. 2A, showing an organic EL device substrate. As shown in FIG. 2B, an organic EL device substrate 10 has an organic EL device 4 in which anode 20, organic EL layer 30 and cathode 40 are formed in this order on transparent substrate 1 with TFT 8. Further, the organic EL device substrate 10 has planarizing layer 35 and partition wall 34. As shown in FIG. 2A, sealing substrate 60 is attached to an organic EL device substrate 10 through sealing material 50. Thereby, an organic EL device panel 100 is manufactured. Further, desiccant 70 which is used for preventing the entry of moisture or oxygen is arranged inside the sealing substrate 60.

TFT 8 used in an embodiment of the present invention is provided on an end part of respective pixels of an organic EL device 4. Example of TFT 8 includes a—Si TFT of which a semiconductor layer is an amorphous silicon and p—Si TFT of which a semiconductor layer is poly-silicon. However, in the present invention, TFT is not limited to these.

Any transparent substrate on which an organic EL device 4 is formed can be used as long as the substrate includes an electric insulating material having high translucency (about more than 80%) for light emitting from organic EL device 4. Examples of the transparent materials include a plate-type material, a sheet-type material or a film-type material comprised of following materials:

1. transparent glass such as alkali glass and alkali-free glass;
2. transparent resin such as polyethylene terephthalate, polycarbonate, polyethersulfone, polyvinyl fluoride, polyacrylate, polypropylene, polyethylen, amorphous state polyolefin and fluorinated resin; and
3. quartz.

However, usable transparent materials are not limited to these.

The kind of a transparent resin is arbitrarily selected according to an application etc. of an organic EL display panel 100 which is going to be manufactured.

A layer structure of an organic EL device 4 which is formed on a transparent substrate1 is not especially limited as long as an organic EL device 4 functions as a device in which light is taken out of a transparent substrate side (the bottom emission type). Examples of a layer structure of an organic EL device 4 include types in which the order of forming layers on transparent substrate 1 is as following (1)-(4):

(1) anode 20 (transparent electrode)/light emitting layer 31/cathode 40 (counter electrode);

(2) anode 20 (transparent electrode)/light emitting layer 31/electron injection layer 33/cathode 40 (counter electrode):

(3) anode 20 (transparent electrode)/hole injection layer 32/light emitting layer 31/cathode 40 (counter electrode); and (4) anode 20 (transparent electrode)/hole injection layer 32/light emitting layer 31/electron injection layer 33/cathode 40 (counter electrode).

Here, light emitting layer 31 is normally formed by using one or more kinds of organic light emitting materials.

Various kinds of materials can be respectively used for the materials of anode 20 (transparent electrode), cathode 40 (counter electrode), partition wall 34, planarizing layer 35, light emitting layer 31, hole injection layer 32 and electron injection layer 33. Metal, alloy, electric conductive compound and mixture thereof, of which work functions are large (for example: 4 eV or more), are preferably used for anode 20 in an embodiment of the present invention. Examples of anode materials include metals such as gold and nickel, and conductive transparent materials such as CuI, ITO, $SnO_2$ and ZnO. However, usable materials are not limited to these. The film thickness of anode 20 depends on the material of anode 20. However, the film thickness can be arbitrary selected from the range of 10 nm-1 µm.

Metal, alloy, electric conductive compound and mixture thereof, of which work functions are small (for example: 4 eV or less), are preferably used for cathode 40 in an embodiment of the present invention. Examples of cathode materials are as follows: natrium; natrium-kalium alloy; alloy or mixture metal of magnesium, lithium, calcium and magnesium with silver; aluminium; Al/AlO$_2$; and rare earth metal such as indium and ytterbium. However, usable materials are not limited to these. The film thickness of cathode 40 depends on a material of cathode 40. However, the film thickness can be arbitrary selected from the range of 10 nm-1 µm. It is preferable that a sheet resistance be several hundreds Ω/□ or less in the case of both anode 20 and cathode 40. In addition, a baseline of work function which is used for selecting an anode 20 material and a cathode 40 material is not limited to 4 eV.

Partition wall 34 of an embodiment of the present invention is necessary to have an insulating property. In the case where the partition wall does not have a sufficient insulating property, an electric current flows between neighboring pixels through partition wall 34. Thereby, a display failure occurs. Examples of partition wall 34 include a polyimide system, a acryl resin system, a novolac resin system and a fluorene system. However, usable materials are not limited to these. A lightsensitive resin which is a partition wall forming material can be applied to a substrate by methods using a spin coater, a bar coater, a roll coater, a die coater and a gravure coater. Next, pattern-exposure and development are performed, thereby a pattern of a partition wall 34 can be formed.

Planarizing layer 35 in an embodiment of the present invention has an inter layer dielectric etc. Planarizing layer 35 can be formed to insulate a plurality of TFTs 8. Silicon oxide can be used for a material of an inter layer dielectric of planarizing layer 35. However, the usable materials are not limited to this. Planarizing layer 35 can be formed by, for example, a vacuum vapor deposition method, a sputtering method or the like. However, usable methods are not limited to these.

Any material can be used for a light emitting layer 31 in an embodiment of the present invention as long as the material can form light emitting layer 31 for an organic EL device 4 having following functions:
1. an injection function (when an electric field is applied, a hole can be injected from anode 20 or hole injection layer 32 while electron can be injected from cathode 40 or electron injection layer 33);
2. a transport function (an injected charge (hole or electron) is moved by an electric field force); and
3. a light emitting function (a place for recombining of electron and hole is provided, thereby light is emitted)

Examples of a material of light emitting layer 31 include a fluorescent bleach of benzothiazole system, benzo imidazole system or benzo oxazole system, and metallic complex of metal chelation oxynoid compound, styryl benzene series compound, distyrylpyrazine derivative, polyphenyl system compound, 12-phthaloperinone, 1,4-diphenyl-1,3-butadiene, 1,1,4,4-tetraphenyl-1,3-butadiene, naphthalimido derivative, perylenes, oxadiazoles, aldazine derivative, pyran derivative, cyclopentadienes, pyrrolo pyrroles, styryl amine derivative, coumar in system compound, aromatic dimethylidyne compound and 8-quinolinols. However, usable materials of light emitting layer 31 are not limited to these. The thickness of the light emitting layer is not especially limited. However, the thickness is usually arbitrarily selected from the range of 5 nm-5 µm.

Any material can be used for a material of hole injection layer 32 if it has hole injection properties or barrier properties for electron. Examples of materials for the layer include triazoles, oxadiazoles, imidazoles, poly aryl alkanes, pyrazolines, pyrazolone derivative, phenylenediamines, aryl amine derivative, amino permutation chalcones, oxazoles, styryl anthracenes, fluorenones, hydrazone derivative, stilbenes, silazanes, poly silane system compound, aniline system copolymer, electroconductive polymer oligomers such as thiophen oligomers, porphyrin compound, aromatic tertiary amine compound, styryl amine compound and aromatic dimethylidyne system compound. However, usable materials for the layer are not limited to these. The thickness of hole injection layer 32 is not especially limited. However, the thickness thereof is usually arbitrarily selected from the range 5 nm-5 µm. Hole injection layer 32 can have a single layer structure comprised of the above-mentioned one or more kind of materials. Hole transport layer 32 or the hole injection transport layer can have a structure including a plurality of layers of which compositions are identical or different.

Further, metal oxides such as $Cu_2O$, $Cr_2O_3$, $Mn_2O_3$, FeOx (x~0.1), NiO, CoO, $Pr_2O_3$, $Ag_2O$, $MoO_2$, $Bi_2O_3$, ZnO, $TiO_2$, $SnO_2$, $ThO_2$, $V_2O_5$, $Nb_2O_5$, $Ta_2O_5$, $MoO_3$, $WO_3$ and $MnO_2$, and inorganic materials such as metal nitrides and metal oxynitrides can be used.

Further, an electron injection layer should have a function which transports electrons injected from a cathode to a light emitting layer 31. Examples of the materials include a metallic complex of nitration fluorenones, anthra quinodimethanes, diphenyl quinone derivative, thio pyran dioxide derivative, heterocycle tetra carboxylic acid anhydride such as naphthalene perylene, carbodiimide, anthra quinodimethanes, anthrones, oxadiazoles and 8-quinolinols, and metal-free phthalocyanine, metal phthalocyanine, and compound in which an alkyl group or a sulfone group is substituted for these material's (metal-free phthalocyanine, metal phthalocyanine) end, and distyrylpyrazine derivative. However, usable materials are not limited to these. The thickness of the electron injection layer 33 is not especially limited. However, the thickness is usually arbitrarily selected from the range of 5 nm-5 µm. The electron injection layer 33 can have a single layer structure comprised of the above-mentioned one or more materials, or can have a structure including a plurality of layers of which compositions are identical or different.

A method for forming respective layers (including anode 30 and cathode 40) of an organic EL device 4 is not especially limited. For example, vacuum vapor-deposition method, spin coat method, cast method, LB method and printing method can be used for forming anode 30, cathode 40, light emitting layer 31, hole injection layer 32 and electron injection layer 33.

Some methods (the vacuum vapor-deposition method, spin coat method, cast method, LB method and printing method) other than the sputtering method are preferably used for a light emitting layer. It is desirable that a light emitting layer 31 be especially a film in which molecules are deposited. Here, "a film in which molecules are deposited" means a thin film which is formed by depositing a gaseous material, or a film which is formed by solidifying a material in a melted state or a liquid state solid. "The film in which molecules are deposited" can be usually distinguished from a thin film (a molecule built-up film) formed by LB method by differences of aggregation structure or higher-order structure and difference of function due to the structure. In the case where a light emitting layer 31 is formed by a spin coat method, a printing method or the like, an application liquid is prepared by dissolving a binder such as a resin and a material compound in a solvent.

As for an organic EL device panel 100 in an embodiment of the present invention, a plurality of organic EL devices 4 are formed on the above-mentioned transparent substrate 1. Colors of emitted light of respective organic EL device 4 may be identical or may be different from each other. Colors of emitted light of respective organic EL device 4 can be arbitrary selected according to applications etc. of organic EL device panel 100.

In an organic EL device panel 100 of an embodiment of the present invention, an organic EL device substrate 10 having an organic EL device 4 is covered by a sealing substrate 60 through a sealing material 50 (a sealing material 50 is described later.). Sealing substrate 60 is used for preventing moisture or oxygen from entering an organic EL device substrate 10. Moisture or oxygen which enters inside of organic EL device substrate 10 can be absorbed by desiccant 70.

A material of sealing substrate 60 in an embodiment of the present invention is not especially limited. Examples of the materials are as follows:
1. transparent glass such as alkali glass and alkali-free glass; and
2. polyethylene terephthalate, polycarbonate, polyethersulfone, polyvinyl fluoride, polyacrylate, polypropylene, polyethylen, amorphous state polyolefin and fluorinated resin.

It is preferable that the materials have a low moisture permeability (0.001 $g/m^2 \cdot day$ or less).

The kind of the material is selected according to applications etc. of an organic EL device panel 100. As for a shape of sealing substrate 60, a planar substrate (a planar glass) can be used, and a substrate having a concave (a sealing cap) can be used. The shape is not especially limited. The size of sealing substrate 60 is not especially limited as long as sealing substrate 60 can cover organic EL device substrate 10. The size can be arbitrary adjusted according to design of a display part or design of circuits.

FIGS. 3-4 are figures in which a forming position of a sealing material 50 described later is shown. A sealing material 50 means both a sealing material including spacers 51 and a sealing material without a spacer.

Figure 3C:
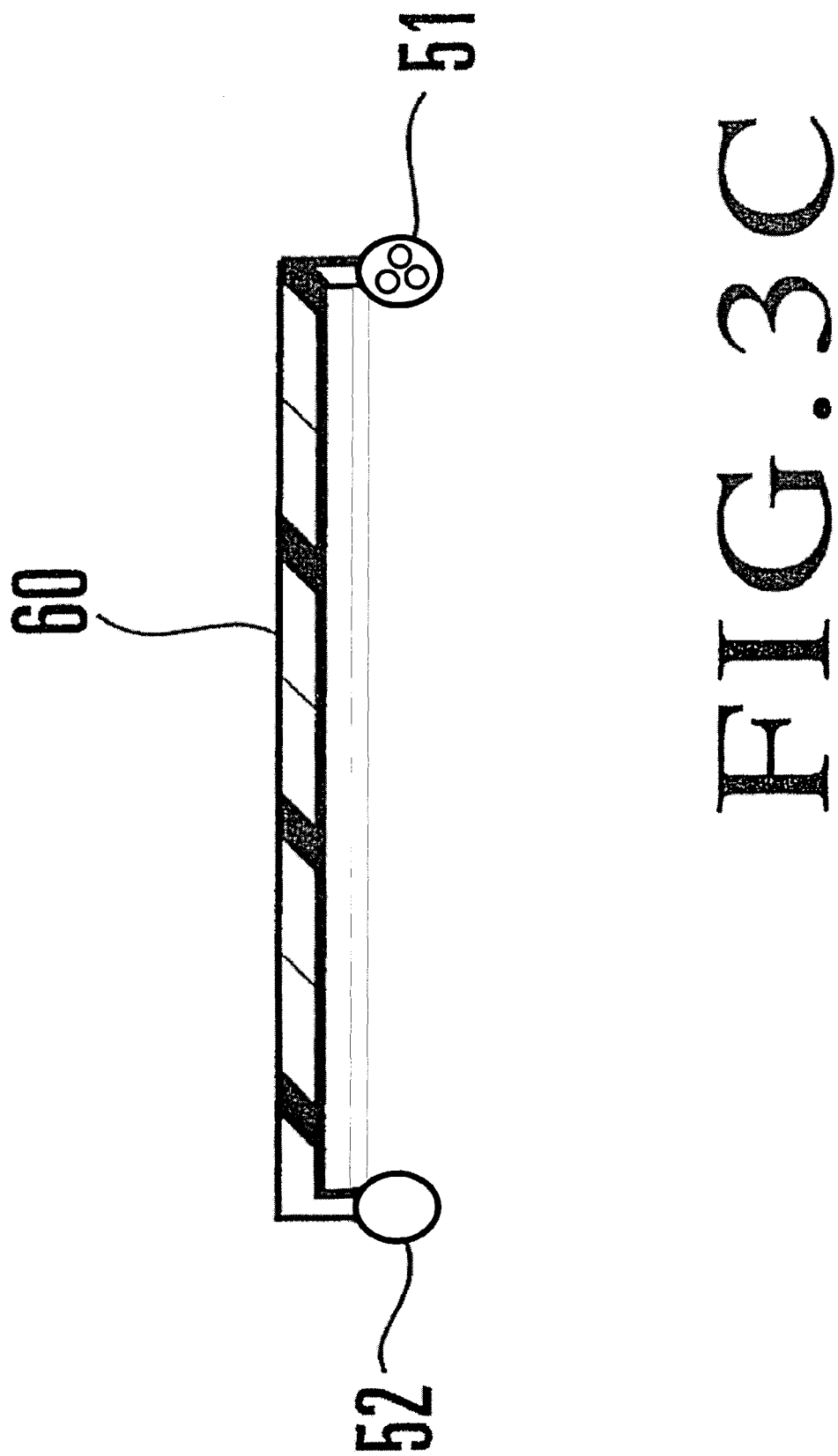
FIG. 3C is a schematic cross-sectional diagram of a sealing substrate (a sealing cap) with a sealing material.
Figure 3D:
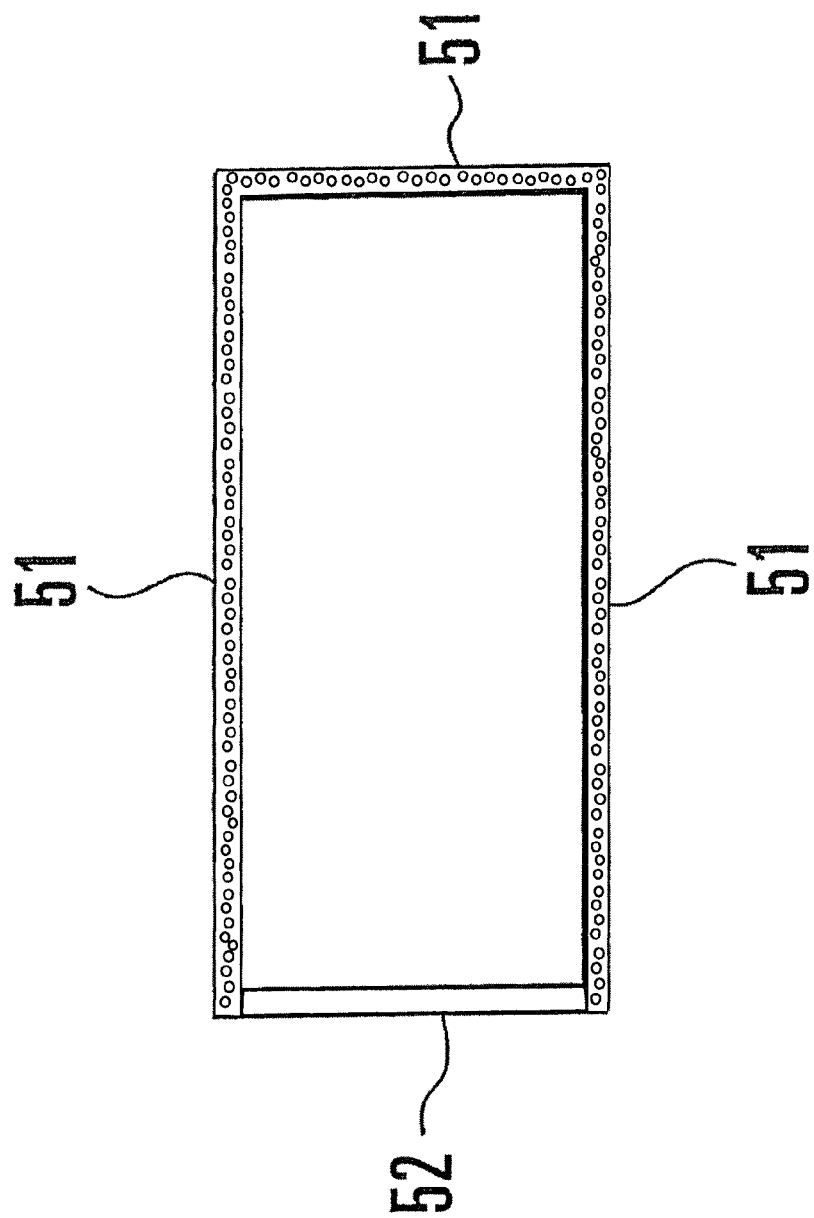
FIG. 3D is a schematic under surface view of a sealing substrate (a sealing cap) with a sealing material.

FIG. 3A is a schematic top view of an organic EL device substrate 10 having overhead crossings between wirings 55. In the view, there is a region 80 in which an organic EL device substrate 10 has overhead crossings between wirings 55. FIG. 3B is a schematic cross-sectional diagram of overhead crossings between wirings 55. In a region 80 of overhead crossings between wirings 55, there are a wiring 55 and an insulating layer 54. Explanation of a wiring 55 and an insulating layer 54 is omitted here, because the explanation is described above. FIG. 3C is a cross-sectional diagram of sealing substrate 60 using sealing material 51 including spacers and sealing material 52 without a spacer. FIG. 3D is a schematic under a surface view of sealing substrate 60 using sealing material 51 including spacers and sealing material 52 without a spacer. FIG. 3E is a schematic top view of an organic EL display panel 100 in which sealing material 51 including spacers and sealing material 52 without a spacer are arranged between transparent substrate 1 and sealing substrate 60. In addition, in FIG. 3C, a length of a region located between elements 51 and 60 is equal to a length of a region located between elements 52 and 60.

Figure 4A:
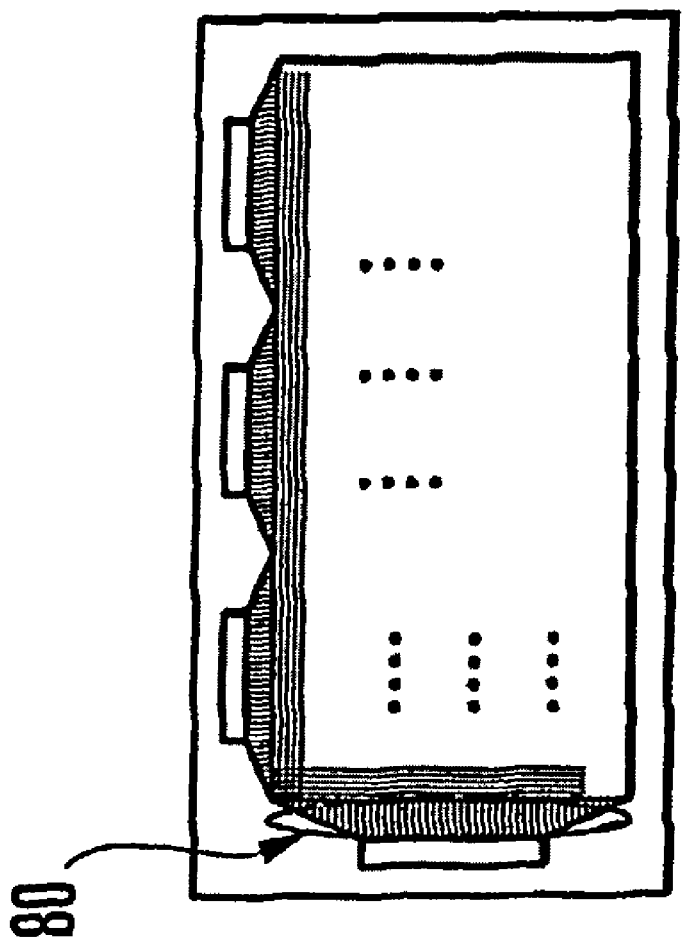
FIG. 4A is a schematic top view of an organic EL device substrate having overhead crossings of wirings.
Figure 4B:
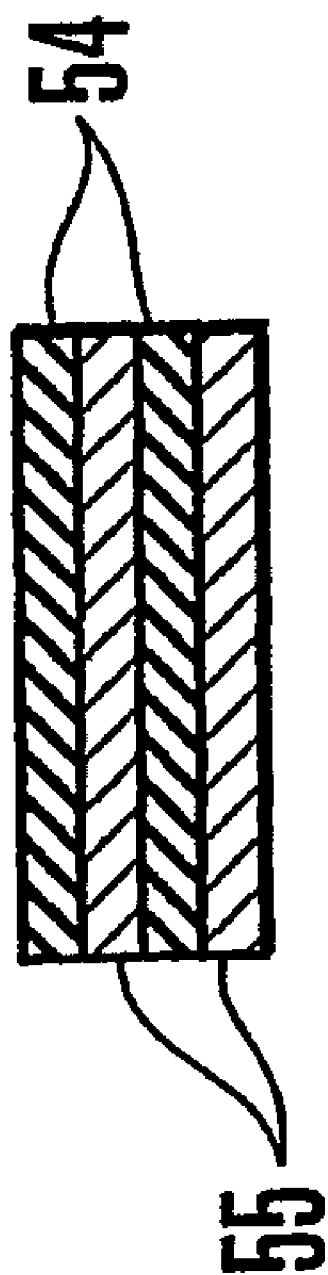
FIG. 4B is a schematic cross-sectional diagram showing overhead crossings of wirings.
Figure 4D:
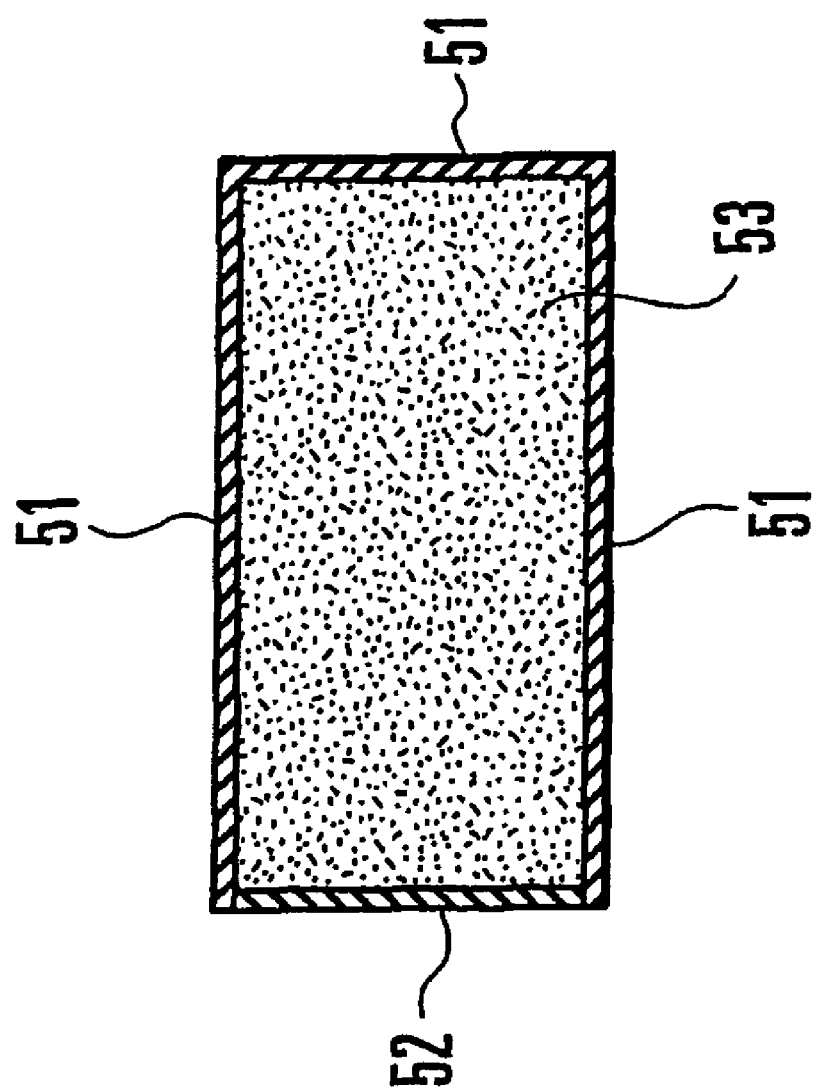
FIG. 4D is a schematic under surface view of a sealing substrate (a planar glass) with a sealing material.
Figure 4E:
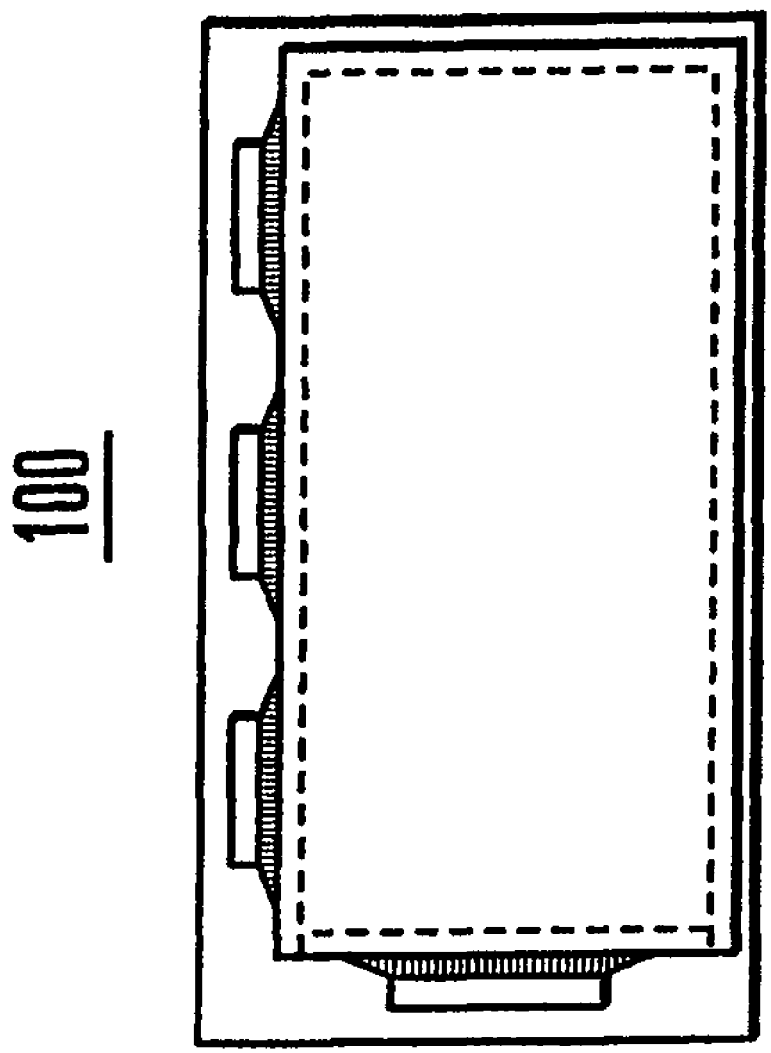
FIG. 4E is a schematic top view of an organic EL device panel (a sealing material is arranged between an organic EL device substrate and a sealing substrate (a planar glass)).

The structure shown in FIGS. 4A and B is the same as the structure shown in FIGS. 3A and B. Therefore, explanation of FIGS. 4A and B is omitted. FIG. 4C is a schematic cross-sectional diagram of sealing substrate 60 using sealing material 51 including spacers and sealing material 52 without a spacer. Further, a heat curing type adhesive is applied to an inside region of a frame of sealing substrate 60. FIG. 4D is a schematic under surface view of sealing substrate 60 using sealing material 51 including spacers and sealing material 52 without a spacer. Further, a heat curing type adhesive is applied to an inside region of a frame of sealing substrate 60. FIG. 4E is a schematic top view of an organic EL display panel 100.

Insulating layer 54, wiring 55, sealing substrate 60 and organic EL device substrate 10 which are related to FIGS. 3A-E and FIGS. 4A-E are described above. Therefore, the explanations of those elements are omitted below. Sealing material 50 is mainly explained below.

The sealing material 50 in an embodiment of the present invention is arranged on a periphery of sealing substrate 60 so that a sealing material 50 surrounds an organic EL device 4. A sealing material 50 is used so that an organic EL device substrate 10 adheres to a sealing substrate 60. A heat curing type adhesive can be used for the sealing material 50. If influence on an organic EL device 4 is considered, a light curing type adhesive is preferable. Examples of a light curing type adhesive are as follows: various acrylates such as ester acrylate, urethane acrylate, epoxy acrylate, melamine acrylate and acrylic resin acrylate; radical system adhesives with the use of resins such as urethane polyester; cation system adhesives with the use of resins such as epoxy and vinyl ether; and thiolene addition type resin system adhesive. Among them, cationic adhesive is preferable, because there is not interference by oxygen and polymerization reaction advances after lightirradiation. An ultraviolet curing type epoxy resin adhesive is preferable as a cation curing type. The following is especially preferable: an ultraviolet curing type adhesive which has a property in which it is cured in 10-90 seconds in the case where UV irradiation of 100 $mW/cm^2$ or more is performed. If it is cured in the time range, there is not bad influence on other elements due to UV irradiation. Further, an ultraviolet curing type adhesive is sufficiently cured, thereby appropriate adhering strength can be obtained. In addition, in view of the efficiency of manufacturing processes, the above-mentioned time range is preferable. If ultraviolet influences respective elements of an organic EL device 4, and characteristics thereof are degraded, a long wave length UV curing type adhesive or a heat curing type adhesive having a property in which it is quickly cured at low temperature are preferable. In addition, in any kind of sealing material 50, low moisture permeability and highly adhering property are preferable. The thickness of a sealing material 50 is not especially limited. However, a thinner sealing material is preferable. About 1 μm-100 μm is preferable. 5 μm-50 μm is more preferable.

A method for forming sealing material 50 is described below.

In a sealing space between an organic EL device substrate 10 and a sealing substrate 60, there are a sealing space without overhead crossings of wirings and a sealing space with overhead crossings of wirings. Sealing material 51 including spacers and sealing material without a spacer are respectively used for both different spaces. Examples of forming methods include a printing method, a nozzle applying method and a transfer method. However, a nozzle coating method is preferable.

An example using a nozzle applying method is described below.

Sealing material 51 including spacers and sealing material without a spacer are respectively put in different syringes. Both sealing materials can be simultaneously applied to desirable positions by an applying robot. In addition, both sealing materials can be respectively applied to desirable positions at different times by an applying robot.

Examples of a material of a spacer in an embodiment of the present invention include a resin bead, a silica bead, a glass bead and a glass fiber. Especially, a glass bead is preferable. A spacer is normally particle-typed in which the diameters of particles are almost the same. However, a shape of a spacer is not especially limited. Spacers having various shapes can be used if the spacer functions as a spacer. As for a size of a spacer, a diameter (circle conversion) is 1 μm-50 μm. 5 μm-20 μm is more preferable. As for a spacer of such a diameter, it is preferable that a grain length be 100 μm or less. A lower limit thereof is not especially limited. However, the lower limit is about the diameter or more. These beads determine a distance between an organic EL device substrate 10 and a sealing substrate 60 in the case of attaching of both members. In addition, these beads are loaded with an applied pressure in adhering.

Sealing material 51 including spacers is used for a region where there is not an overhead crossing of wirings, the region being in a sealing space between an organic EL device substrate 10 and a sealing substrate 60. Therefore, the thickness of the adhesive can be control led. Most of a sealing space is a region where there is not an overhead crossing of wirings 55. Therefore, even if there is not a spacer in a region of overhead crossings of wirings 55, the adhesive thickness of an organic EL device panel 100 can be controlled.

In a sealing space between an organic EL device substrate 10 and a sealing substrate 60, sealing material 52 without a spacer is used for a region where there is an overhead crossing of wirings. Therefore, even if a sealing pressure is excessive, a spacer does not sink. Thereby, an upper wiring does not come in contact with a lower wiring. In addition, in the case where sealing is performed for a whole region, sealing material 52 without a spacer can be used for an inside region where an organic EL device 4 is arranged. So, if there are many overhead crossings of wirings for the purpose of achieving a high definition and a narrow frame, a sealing material 50 does not cause a bad influence.

When an organic EL device substrate 10 is sealed by a sealing substrate 60, it is preferable that a desiccant 70 be simultaneously put between both members. The desiccant 70 is used for absorbing moisture. Here, the moisture is both moisture remaining inside of a sealing space and moisture entering from outside a little. Alkali metals, alkaline earth metals, and oxide and hydride thereof, and other desiccants can be used for the desiccant 70. However, usable desiccants are not limited to these. It is desirable that the desiccant 70 absorbs not only moisture but also oxygen.

In the present invention, a sealing material without a spacer is used at a region where there is an overhead crossing of wirings. Therefore, even if a sealing pressure is excessive, a spacer does not sink. Thereby, an upper wiring does not come in contact with a lower wiring. Therefore, the upper wiring is not electrically connected with the lower wiring. So, if there are many overhead crossings of wirings for the purpose of achieving a high definition and a narrow frame, a sealing material does not cause a bad influence.

EXAMPLES

Hereinafter, the present invention is further explained by Examples and Comparative Examples. However, the present invention is not limited to Examples described below.

Example 1

A p-Si TFT was formed on transparent substrate 1. An ITO film of 150 nm thickness including a power wire 2 and a scan line 3 which are driving wirings of the TFT was deposited by a sputtering method. In addition, as shown FIG. 1, a frame had a region where there was an overhead crossing of wirings 6.

Next, a pattern of a ITO film was performed. Thereby, anode 20 was formed. In this way, an active driving type substrate (hereinafter, this is called "a supporting substrate") of 5 inches QVGA (320×240) was manufactured.

Next, a lightsensitive layer was formed by applying a lightsensitive resin solution comprised of a polyimide resin to a supporting substrate with anode 20. A series of patterning processing (pattern-exposure, development etc.) was performed. Thereby, partition wall 34 of 1 μm thickness as a rib of pixels was formed.

Next, a hole transport layer of 50 nm thickness and a light emitting layer 31 of 80 nm thickness were sequentially formed between partition walls 34. The hole transport layer was comprised of a mixture of poly (3,4-ethylenedioxythiophene) and polystyrene sulfonic acid. The light emitting layer was comprised of poly [2-methoxy-5-(2'-Ethyl hexyloxy)-1,4-phenylenevinylene] (MEHPPV).

Next, sequentially, Ca was deposited to 5 nm thickness, and Al was deposited 150 nm thickness as cathode 40. Thereby, an organic EL device 4 was manufactured.

On the other hand, an ultraviolet curing type adhesive is applied to a periphery of a sealing cap (a sealing substrate 60) comprised of an alkali-free glass by a nozzle coating method. An ultraviolet curing type adhesive including spacers and an ultraviolet curing type adhesive without a spacer were separately and respectively filled in syringes which were used for the nozzle coat. The spacer was a glass bead having a diameter of 20 μm. The spacers were included in an ultraviolet curing type adhesive, in which a concentration of the spacers was 1%. When a support substrate with an organic EL device 4 was attached to the sealing cap (sealing substrate 60), an ultraviolet curing type adhesive without a spacer was used for a part of a frame of the sealing cap (sealing substrate 60), wherein the part faces a region where there were overhead crossings of wirings 55 on the support substrate. An ultraviolet curing type adhesive without a spacer was used for the other part of the frame of the sealing cap (sealing substrate 60).

Finally, a desiccant 70 was attached to an inside of a sealing cap (a sealing substrate 60). A supporting substrate on which an organic EL device 4 was formed was attached to a sealing cap (a sealing substrate 60) to which an ultraviolet curing type adhesive was applied. Attaching was performed for 90 seconds under a condition where a sealing pressure was 1 kg/cm$^2$ and UV output was 100 mW/cm$^2$.

Comparative Example 1

An organic EL device panel 100 was manufactured by the same method as Example 1 except that an ultraviolet curing type adhesive including spacers was formed on all part of a frame of a sealing cap (a sealing substrate 60).

<Evaluation 1>

An organic EL device panel 10 manufactured in Example 1 could be driven. However, an organic EL device panel 100 manufactured in Comparative Example 1 could not be driven because power wire 6 was electrically connected to a scan line 7, or power wire 2 was electrically connected to a scan line 3.

Example 2

An organic EL device 4 was manufactured by using the same method as Example 1. A planar glass comprised of an alkali-free glass was used for a sealing substrate 60. An ultraviolet curing type adhesive was applied to a frame of the planar glass using a nozzle. An ultraviolet curing type adhesive including spacers and an ultraviolet curing type adhesive without a spacer were separately and respectively filled in syringes which were used for the nozzle coat. When a support substrate with an organic EL device 4 was attached to the planar glass (sealing substrate 60), an ultraviolet curing type adhesive without a spacer was used for a part of a frame of the planar glass (sealing substrate 60), wherein the part faces a region where there were overhead crossings of wirings 55 on the support substrate. An ultraviolet curing type adhesive without a spacer was used for the other part of the frame of the planar glass (sealing substrate 60). The spacer was a glass bead having a diameter of 20 μm. The spacers were included in an ultraviolet curing type adhesive, in which a concentration of the spacers was 1%. A heat curing type adhesive without a spacer was applied to a region inside the frame of the planar glass (sealing substrate 60).

Next, the support substrate with an organic EL device 4 was attached to the planar glass (sealing substrate 60) with both adhesives under conditions of a reduced pressure of 10 kPa and a sealing pressure of 0.5 kg/cm$^2$. While the conditions were kept, UV irradiation of 100 mW/cm$^2$ output was performed for 90 seconds.

Finally, baking under 120 degrees Celsius was performed for 1 hour. Thereby, the heat curing type adhesive 53 was cured.

Comparative Example 2

An organic EL device panel 100 was manufactured by the same method as Example 2 except that an ultraviolet curing type adhesive including spacers were used for all parts of a frame of a planar glass (sealing substrate 60).

<Evaluation 2>

An organic EL device panel 10 manufactured in Example 2 could be driven. However, an organic EL device panel 100 manufactured in Comparative Example 2 could not be driven because power wire 6 was electrically connected to a scan line 7, or power wire 2 was electrically connected to a scan line 3.

What is claimed is:

1. An organic EL device panel, comprising:
    an organic EL device substrate, comprising:
        a substrate,
        a plurality of organic EL devices which are formed on the substrate, and
        a plurality of wirings for driving the organic EL devices;
    a sealing substrate which covers the organic EL devices; and
    a sealing material which is used for attaching the organic EL device substrate to the sealing substrate,
    wherein a space for placing the sealing material includes a region having a sealing space where there is an overhead crossing of wirings,
    wherein the organic EL device substrate is attached to the sealing substrate by the sealing material without a spacer in the region where there is the overhead crossing of wirings,
    and
    wherein the organic EL device substrate is attached to the sealing substrate by the sealing material including spacers in a region having a sealing space where there is no overhead crossing of wirings.

2. The organic EL device panel according to claim 1, wherein a desiccant is arranged inside the sealing substrate.

3. The organic EL device panel according to claim 1, wherein the sealing material is a heat curing type adhesive or a light curing type adhesive.

4. A method for manufacturing an organic EL device panel, comprising:
    forming an organic EL device substrate with a plurality of wirings for driving organic EL devices;
    preparing a sealing substrate for covering the organic EL devices; and
    attaching the organic EL device substrate to the sealing substrate by a sealing material,
    wherein space for placing the sealing material includes a region having a sealing space where there is an overhead crossing of wirings,
    wherein the organic EL device substrate is attached to the sealing substrate by the sealing material without a spacer in the region where there is the overhead crossing of wirings,
    and
    wherein the organic EL device substrate is attached to the sealing substrate by the sealing material including spacers in a region having a sealing space where there is no overhead crossing of wirings.

5. The method for manufacturing an organic EL device panel according to claim 4,
    wherein the sealing material is a heat curing type adhesive or a light curing type adhesive.

6. The method for manufacturing an organic EL device panel according to claim 4,
    wherein a desiccant is arranged inside the sealing substrate.

* * * * *